(12) United States Patent
Knaepen et al.

(10) Patent No.: US 9,552,979 B2
(45) Date of Patent: Jan. 24, 2017

(54) CYCLIC ALUMINUM NITRIDE DEPOSITION IN A BATCH REACTOR

(71) Applicant: ASM IP Holding B.V., AP Almere (NL)

(72) Inventors: Werner Knaepen, Leuven (BE); Bert Jongbloed, Oud-Heverlee (BE); Dieter Pierreux, Dilbeek (BE); Peter Zagwijn, LX Nijkerk (NL); Hessel Sprey, Kessel-Lo (BE); Cornelius A. van der Jeugd, Heverlee (BE); Marinus Josephus de Blank, Heverlee (BE); Robin Roelofs, Leuven (BE); Qi Xie, Leuven (BE); Jan Willem Maes, Wilrijk (BE)

(73) Assignee: ASM IP HOLDING B.V. (NL)

( * ) Notice: Subject to any disclaimer, the term of this patent is extended or adjusted under 35 U.S.C. 154(b) by 572 days.

(21) Appl. No.: 13/907,718

(22) Filed: May 31, 2013

(65) Prior Publication Data

US 2014/0357090 A1 Dec. 4, 2014

(51) Int. Cl.
*H01L 21/469* (2006.01)
*H01L 21/31* (2006.01)
(Continued)

(52) U.S. Cl.
CPC ....... *H01L 21/02178* (2013.01); *C23C 16/303* (2013.01); *C23C 16/4583* (2013.01);
(Continued)

(58) Field of Classification Search
CPC ........... H01L 21/02178; H01L 21/0228; H01L 21/0254; H01L 21/0262; H01L 29/2003; C23C 16/303; C23C 16/4583; C23C 16/45525
See application file for complete search history.

(56) References Cited

U.S. PATENT DOCUMENTS 5,915,164 A * 6/1999 Taskar et al. ................... 438/47
6,200,893 B1 * 3/2001 Sneh ............................. 438/685
(Continued)

OTHER PUBLICATIONS

Huang et al., "ALD-grown Ultrathin AlN Film for Passivation of AlGaN/GaN HEMTs", CS MANTECH Conference, Apr. 23-26, 2012, Boston, Massachusetts, USA, 4 pages.
(Continued)

*Primary Examiner* — Mary Wilczewski
(74) *Attorney, Agent, or Firm* — Knobbe, Martens, Olson & Bear LLP (57) ABSTRACT

A process for depositing aluminum nitride is disclosed. The process comprises providing a plurality of semiconductor substrates in a batch process chamber and depositing an aluminum nitride layer on the substrates by performing a plurality of deposition cycles without exposing the substrates to plasma during the deposition cycles. Each deposition cycle comprises flowing an aluminum precursor pulse into the batch process chamber, removing the aluminum precursor from the batch process chamber, and removing the nitrogen precursor from the batch process chamber after flowing the nitrogen precursor and before flowing another pulse of the aluminum precursor. The process chamber may be a hot wall process chamber and the deposition may occur at a deposition pressure of less than 1 Torr.

25 Claims, 7 Drawing Sheets

(51) Int. Cl.
*H01L 21/02* (2006.01)
*C23C 16/30* (2006.01)
*C23C 16/455* (2006.01)
*C23C 16/458* (2006.01)
*H01L 29/20* (2006.01)

(52) U.S. Cl.
CPC .... *C23C 16/45525* (2013.01); *H01L 21/0228* (2013.01); *H01L 21/0254* (2013.01); *H01L 21/0262* (2013.01); *H01L 29/2003* (2013.01)

(56) References Cited

U.S. PATENT DOCUMENTS

| | | | |
|---|---|---|---|
| 6,218,293 B1* | 4/2001 | Kraus et al. | 438/644 |
| 6,297,538 B1* | 10/2001 | Kolodzey et al. | 257/410 |
| 6,506,676 B2 | 1/2003 | Park et al. | |
| 6,759,081 B2 | 7/2004 | Huganen et al. | |
| 7,494,937 B2* | 2/2009 | Clark | 438/778 |
| 8,110,491 B2 | 2/2012 | Harada | |
| 8,329,541 B2* | 12/2012 | Ye et al. | 438/285 |
| 8,383,471 B1* | 2/2013 | Shinihara et al. | 438/167 |
| 8,389,977 B2* | 3/2013 | Chu et al. | 257/24 |
| 8,846,502 B2* | 9/2014 | Haukka et al. | 438/478 |
| 2004/0129969 A1* | 7/2004 | Colombo | H01L 21/28194 257/310 |
| 2007/0237698 A1* | 10/2007 | Clark | C23C 16/34 423/263 |
| 2009/0146186 A1* | 6/2009 | Kub et al. | 257/194 |
| 2010/0006895 A1* | 1/2010 | Cao et al. | 257/192 |
| 2011/0083735 A1 | 4/2011 | Park et al. | |
| 2012/0098599 A1* | 4/2012 | Chang et al. | 330/277 |
| 2013/0092947 A1* | 4/2013 | Green et al. | 257/76 |

OTHER PUBLICATIONS

Mayer et al. "Mechanism of Nucleation and Atomic Layer Growth of AlN on Si", *American Chemical Society*, vol. 3, pp. 641-646; 1991.

\* cited by examiner

CYCLIC ALUMINUM NITRIDE DEPOSITION IN A BATCH REACTOR

BACKGROUND OF THE INVENTION

Field of the Invention

The invention relates to the manufacture of semiconductor devices and, more particularly, the deposition of aluminum nitride.

Background

Aluminum nitride (AlN) is used to form various semiconductor devices. For example, AlN is increasingly used as a passivation film in GaN based semiconductor devices or as a Back Surface Field layer in solar cells. AlN, however, can be difficult to deposit with high uniformity. Consequently, there is a continuing need for processes to deposit AlN.

SUMMARY

In accordance with one aspect, a process for depositing an aluminum nitride film is provided. The process comprises providing a batch furnace having a hot wall process chamber, loading a plurality of substrates into the process chamber, and performing a plurality of deposition cycles in the process chamber. Each cycle comprises exposing the substrates to a pulse of an aluminum precursor, purging the aluminum precursor away from the substrates, exposing the substrates to a pulse of nitrogen precursor, and purging the nitrogen precursor away from the plurality of substrates. At least some of the cycles are performed at a deposition temperature of about 300° C. to about 375° C. The aluminum precursor may be selected from the group consisting of alkyl aluminum compounds, alkyl-substituted aluminum chloride compounds, and aluminum hydride compounds.

In some embodiments, the deposition temperature and/or the duration of the nitrogen precursor pulse decrease over time. In some embodiments, the deposition temperature is at a first value of about 350° C.±about 25° C. during an initial set of deposition cycles, and wherein the deposition temperature is at a second value of about 300° C.±about 25° C. during a subsequent set of deposition cycles.

In accordance with another aspect, a process for depositing aluminum nitride is provided. The process comprises providing a plurality of semiconductor substrates in a batch process chamber and depositing an aluminum nitride layer on the substrates in the batch process chamber by performing a plurality of deposition cycles. Each deposition cycle comprises flowing an aluminum precursor pulse into the batch process chamber, removing aluminum precursor from the batch process chamber, subsequently flowing a nitrogen precursor pulse into the batch process chamber, and removing nitrogen precursor from the batch process chamber after flowing the nitrogen precursor and before flowing another pulse of the aluminum precursor. The substrates are not exposed to plasma during the deposition cycles.

In some embodiments, the process chamber is a hot wall chamber. In some embodiments, the deposited aluminum nitride layer has a non-uniformity of 1σ=0.25% or better across the substrate. The deposition pressure may be about 100 to about 700 mTorr in some embodiments.

DETAILED DESCRIPTION

AlN films have typically been deposited on substrates by plasma-assisted techniques. It has been found, however, that exposing the substrates to plasma may detrimentally impact the passivation properties of the layer and/or the plasma may damage devices on the substrate.

A thermal deposition, without the use of plasma during the deposition, has been suggested by T. M. Mayer, J. W. Rogers and T. A. Michalske, Chem. Mater. 1991, 3, 641-646, "Mechanism of Nucleation and Atomic Layer Growth of AlN on Si." However, attempts at atomic layer deposition of AlN films have not provided deposited films that are uniform across a substrate, even in state-of-the-art single wafer reactors used in the semiconductor processing industry. Thus, these thermal depositions have been considered unsuccessful due to the unacceptably poor film uniformities that are produced.

Without being limited by theory, it is believed that the above-noted attempts at atomic layer deposition produced non-self-limiting and uncontrolled deposition over at least some parts of the substrate, thereby causing large variations in film thickness across the substrate. Thus, while atomic layer growth having a roughly monolayer by monolayer deposition of AlN was desired, the depositions appeared to in fact contain a strong chemical vapor deposition component in which film growth was not self-limited. As a result, the controllability of the thermal deposition has been considered poor and insufficient for depositions across a substrate, particularly in comparison to results achievable with plasma-assisted depositions.

Advantageously, the inventors have developed a thermal AlN deposition process that provides high uniformity across a substrate, even without the use of plasma. In some embodiments, the process comprises providing a plurality of semiconductor substrates in a batch process chamber and depositing an aluminum nitride layer, or film, on the substrates in the batch process chamber by performing a plurality of deposition cycles, without exposing the substrate to plasma during the deposition cycles. Each deposition cycle comprises flowing an aluminum precursor pulse into the batch process chamber, removing aluminum precursor from the batch process chamber, subsequently flowing a nitrogen precursor pulse into the batch process chamber, and removing nitrogen precursor from the batch process chamber after flowing the nitrogen precursor and before flowing another pulse of the aluminum precursor. The process chamber may be a hot wall process chamber and the deposition may occur at a deposition pressure of less than about 1 Torr, about 50 mTorr to about 900 mTorr, about 100 mTorr to about 700 mTorr, or about 150 mTorr to about 550 mTorr. In some embodiments, the deposition temperature may be about 400° C. or less, about 150° C. to about 375° C., about 240° C. to about 375° C., or about 275° C. to about 375° C.

Without being limited by theory, it is believed that the deposition pressures typically utilized in single wafer reactors may encourage undesired reactions between aluminum precursors, thereby causing non-self-limited deposition of aluminum on a substrate. Typical single wafer reactor deposition pressures may be in the range of 1 to 10 Torr. According to some embodiments, the deposition pressure is about 50 mTorr to about 900 mTorr, about 100 mTorr to about 700 mTorr, or about 150 mTorr to about 550 mTorr, which may reduce the non-self-limiting component of the AlN deposition. In conjunction with relatively long precursor pulse durations of, e.g., 3 seconds or more, the low pressures allow good saturation of the substrate surface with the precursor, while providing low levels of non-self-limited deposition. It will be appreciated that absorbed precursors on the walls or incompletely reacted deposits on the walls of the process chamber can adversely affect the deposition and may generate contaminants. Without being limited by theory, it is believed that the use of a hot wall batch process chamber can reduce the amount of poor quality deposits on the chamber walls, thereby improving the quality of films deposited on the substrates.

Advantageously, AlN films deposited according to some embodiments can have exceptional uniformity across a substrate. In some embodiments, a film non-uniformity of 1σ=1% or better, 1σ=0.5% or better, or 1σ=0.25% or better is achieved across the substrate.

Reference will now be made to the Figures, in which like numerals refer to like features throughout.

Figure 1:
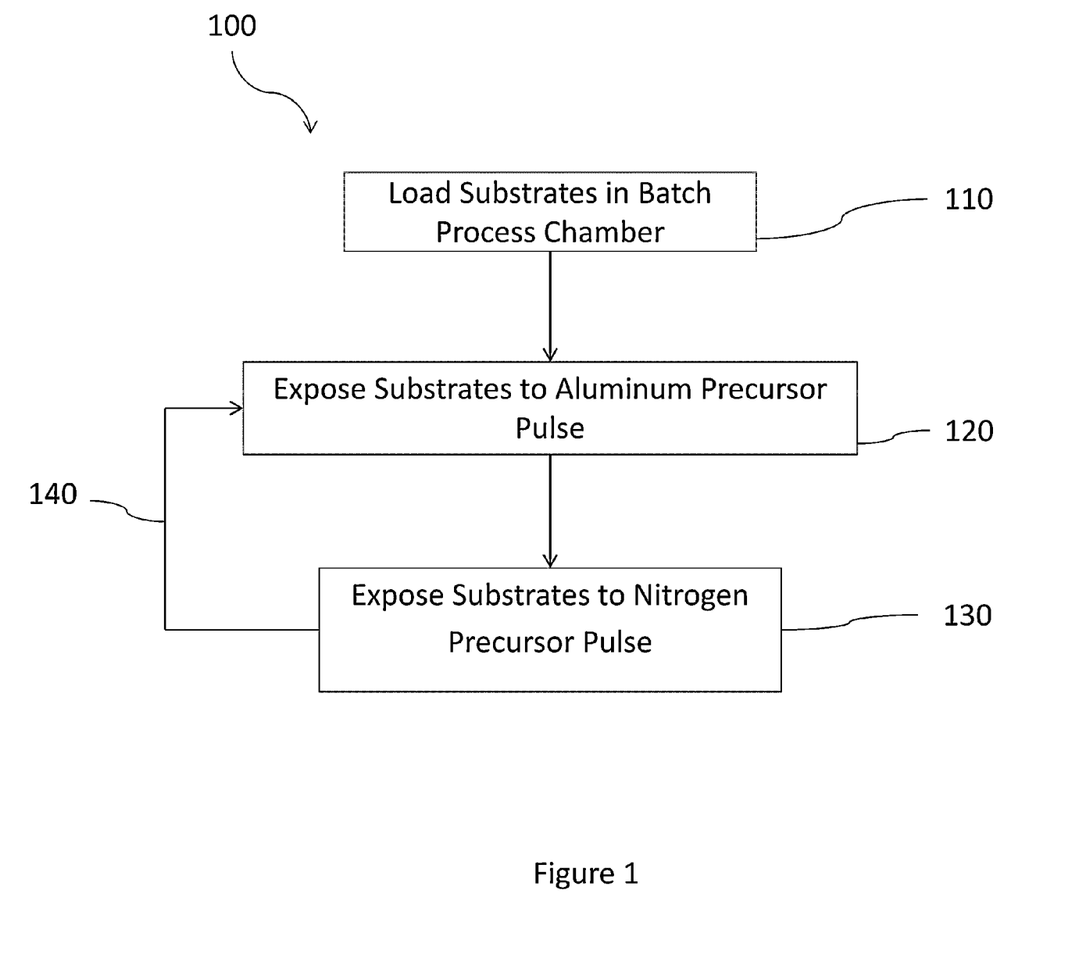
FIG. 1 is a flow chart generally illustrating a process for forming an AlN film, according to some embodiments.

FIG. 1 is a flow chart generally illustrating a process 100 for forming an AlN film, according to some embodiments. The process 100 may be performed in the process chamber of a batch reactor, which may accommodate a plurality of substrates, for example, 25 or more substrates, or 25 to 150 substrates. In some embodiments, the batch process chamber is a hot wall chamber, in which the walls of the chamber are actively heated to, e.g., a process temperature. As noted herein, such a hot wall process chamber may provide advantages for achieving uniform process results. The substrates processed in the batch process chamber may be any workpiece upon which AlN is to be deposited, including workpieces formed of a semiconductor, such as semiconductor wafers.

With reference to FIG. 1, a plurality of substrates is loaded into the batch process chamber at block 110. The substrates may be heated to a deposition temperature of about 400° C. or less, about 150° C. to about 375° C., about 240° C. to about 375° C., or about 300° C. to about 375° C. In addition, a deposition pressure may be established in the batch process chamber, the deposition pressure being about 50 mTorr to about 900 mTorr, about 100 mTorr to about 700 mTorr, or about 150 mTorr to about 550 mTorr.

At block 120, the substrates may be exposed to an aluminum precursor in an aluminum precursor pulse. In some embodiments, the flow of the aluminum precursor into the process chamber starts at the beginning of the pulse and completely terminates at the end of the pulse. In some embodiments, the pulse duration may be about 2 seconds or more, about 2 seconds to about 20 seconds, about 3 seconds to about 16 seconds, or about 5 seconds to about 10 seconds. Without being limited by theory, it believed that durations on the order of seconds, including 2 or 3 seconds or more, are desirable to achieve a high level of self-limiting coverage of a substrate surface with the aluminum precursor. However, excessively long durations may result in reaction of individual aluminum precursor molecules with other aluminum precursor molecules, causing an undesired non-self-limiting deposition. The aluminum precursor pulse duration may be less than about 20 seconds, or less than about 16 seconds, or about 7 seconds in some embodiments.

Examples of aluminum precursors include organic aluminum precursors, such as alkyl aluminum compounds and alkyl-substituted aluminum chloride compounds, and alkyl-substituted aluminum hydride compounds. The organic aluminum precursor may have the formula $AlR_3$, wherein the R is selected from substituted, branched, linear or cyclic C1-C10 hydrocarbons. In some embodiments 0-3 of the R groups are methyl and the rest are ethyl. In some embodiments, the organic aluminum precursor may be trimethylaluminum (TMA). In some embodiments, the aluminum precursor has both a halide ligand and organic ligand, for example $AlR_xX_{3-x}$, wherein x is from 1 to 2 and R is organic ligand, such as alkyl or alkenyl and X is halide, such as chloride. Examples of this kind of aluminum precursor might be, for example, dimethylaluminumchloride $(CH_3)_2AlCl$. In some other embodiments the aluminum precursor is an Al halide, such as $AlCl_3$ or $AlI_3$.

After terminating the aluminum precursor pulse, at block 130, the substrates may be exposed to a nitrogen precursor in a nitrogen precursor pulse. Examples of nitrogen precursors include ammonia, hydrazine, and hydrazine derivatives. In some embodiments, the flow of the nitrogen precursor into the process chamber starts at the beginning of the pulse and completely terminates at the end of the pulse. In some embodiments, the pulse duration may be about 3 seconds or more, or about 10 seconds or more. In some embodiments, the pulse duration may be about 3 seconds to about 90 seconds, about 3 seconds to about 30 seconds, or about 3 seconds to about 10 seconds. Without being limited by theory, it believed that durations of about 3 seconds to about 10 seconds desirably allow the nitrogen precursor to fully react with the aluminum precursors on the substrate surface. Longer durations can increase the deposited film thickness.

With continued reference to FIG. 1, the blocks 120 and 130 constitute a deposition cycle 140. The deposition cycle may be repeated a plurality of times to form an aluminum nitride film of a desired thickness. It will be appreciated that the film may completely cover the substrate, or may be localized at discrete locations on the substrate, depending on, for example, the reactivity of the aluminum precursor with different regions on the substrate surface.

While not illustrated of ease of description, it will be appreciated that the cycle 140 can include one or more precursor removal steps. For example, between blocks 120 and 130, aluminum precursor can be removed or purged from the proximity of the substrates by, e.g., flowing inert gas into the process chamber without flowing precursor species and/or by evacuating the process chamber to remove the aluminum precursor from the chamber.

Similarly, after the block 130 and before again exposing the substrate to aluminum precursor, the nitrogen precursor can be removed from the proximity of the substrates. This may also be accomplished by, e.g., flowing inert gas into the process chamber without flowing precursors species and/or by evacuating the process chamber to remove the nitrogen precursor from the chamber. Thus, in some embodiments, a deposition cycle may include:

Exposing substrates to an aluminum precursor pulse;
Removing the aluminum precursor from the process chamber;
Exposing substrates to a nitrogen precursor pulse; and
Removing the nitrogen precursor from the process chamber.

The precursor removal times for the aluminum and nitrogen precursors may be the same or different. In some embodiments, the aluminum precursor purge time is about 1 to about 7 seconds and the nitrogen precursor purge time is about 7 to about 30 seconds, or about 7 to about 15 seconds. It has been found that the duration of the aluminum precursor purge does not strongly influence film uniformity, but the duration of the nitrogen precursor purge does more strongly influences film uniformity. In some embodiments, the duration of the nitrogen precursor purge is at least about 1.5, about 2, or about 3 times the duration of the aluminum precursor purge.

As noted herein, the deposition cycles can be repeated to form an AlN film of a desired thickness. In some embodiments, all cycles may be performed under the same conditions, e.g., the same deposition temperature and/or pressure. In some other embodiments, the conditions for performing a first set of one or more deposition cycles during a first time period can be different from the conditions for performing a second set of one or more deposition cycles during a second time period.

In some embodiments, the deposition temperature for a first set of deposition cycles is higher than for a second set of deposition cycles. Without being limited by theory, it is believed that the deposition rate of the AlN film is strongly dependent upon the surface that the film is deposited upon. It has been found that the AlN film deposition rate increases after performing an initial set of deposition cycles and it is believed that this lower initial rate is due to the presence of an inhibition period which disappears once a closed AlN film is formed on the substrate surface. It has been found that increasing the deposition temperature during this inhibition period can increase the deposition rate, while maintaining high film uniformity. In some embodiments, the deposition temperature during a first period of performing the deposition cycles is at least about 25° C. higher, at least about 25° C. to about 75° C. higher, or at least about 25° C. to about 50° C. higher than the deposition temperature during a subsequent period of performing the deposition cycles. In some embodiments, the deposition temperature during the first period is about 350° C.±about 25° C., or about 350° C.±about 10° C., and the deposition temperature during the second period is about 300° C.±about 25° C., or about 300° C.±about 10° C. In some embodiments, the first period may include about 10 or more deposition cycles, about 10 to about 50 deposition cycles, or about 20 to about 40 deposition cycles.

It has also been found that the deposition rate becomes less influenced by the pulse duration of the nitrogen precursor after passing the inhibition period. In some embodiments, the nitrogen precursor pulse duration can decrease over time. For example, nitrogen precursor pulse durations in the first period of performing the deposition cycles can be higher than in the second period, e.g., the period after passing the inhibition period. For example, the nitrogen precursor pulses times during the first period may be about 10 seconds or more, falling to about 3 to about 10 seconds or about 3 to about 5 seconds in the second period.

It will be appreciated that the deposited AlN film may be used in various applications. For example, the AlN film may be used as a passivation layer, such as on gallium nitride (GaN). The use of an AlN passivation layer on GaN may strongly reduce interface states. In some embodiments, after depositing the AlN passivation film, a gate dielectric can be deposited of silicon oxide ($SiO_2$), zirconium oxide ($ZrO_2$), hafnium oxide ($HfO_2$), aluminum oxide ($Al_2O_3$), or a bi- or tri-layer or a nano-laminate of any combination of these oxides, which may be deposited by an atomic layer deposition process using a cyclic exposure of the substrates to precursors, for example, the substrates may be exposed to different precursors at different times. In some embodiments, the AlN passivation film and the gate dielectric can be deposited in-situ, in the same process chamber.

EXAMPLES

AlN films were deposited in a A412 vertical furnace commercially available from ASM International, Versterkerstraat 4, 1322 AP Almere, the Netherlands. The furnace has a linerless process chamber, aluminum and nitrogen precursors were injected into the process chamber, each gas flowing through a separated multiple hole injector. Purge gas may be injected through the multiple hole injectors and/or through a "dump" injector, which is an injector tube without intermediate holes but having an open end near the top of the process tube. The gases are evacuated at the bottom of the process tube. Substrates are accommodated in a rack, or "boat," which may be rotated during depositions inside the process chamber. The process chamber is a hot wall chamber.

Trimethylaluminum (TMA) was used as the aluminum precursor and $NH_3$ as the nitrogen precursor. Unless otherwise specified, the depositions were performed at 350° C., 70 cycles of deposition were performed, boat rotation was applied, and the following cycle was performed:

|  | Flow rate, Gas flowed | Duration |
| --- | --- | --- |
| TMA pulse: | 0.4 g/min TMA | 7 s |
| TMA purge: | 5 slm $N_2$ | 7 s |
| $NH_3$ pulse: | 1 slm $NH_3$ | 30 s |
| $NH_3$ purge: | 5 slm $N_2$ | 30 s |

During the purge steps, the 5 slm $N_2$ was injected through the dump injector. Additional small $N_2$ flows were flown through the multiple hole injectors. The chamber pressure was not controlled but maximum pumping and evacuation of the chamber was also applied, resulting in a chamber pressure in a range of 150 to 550 mTorr. The pressure of 150 mTorr is the pressure during the precursor exposure steps and the pressure of 550 mTorr is the pressure during the purge steps.

Figure 2:
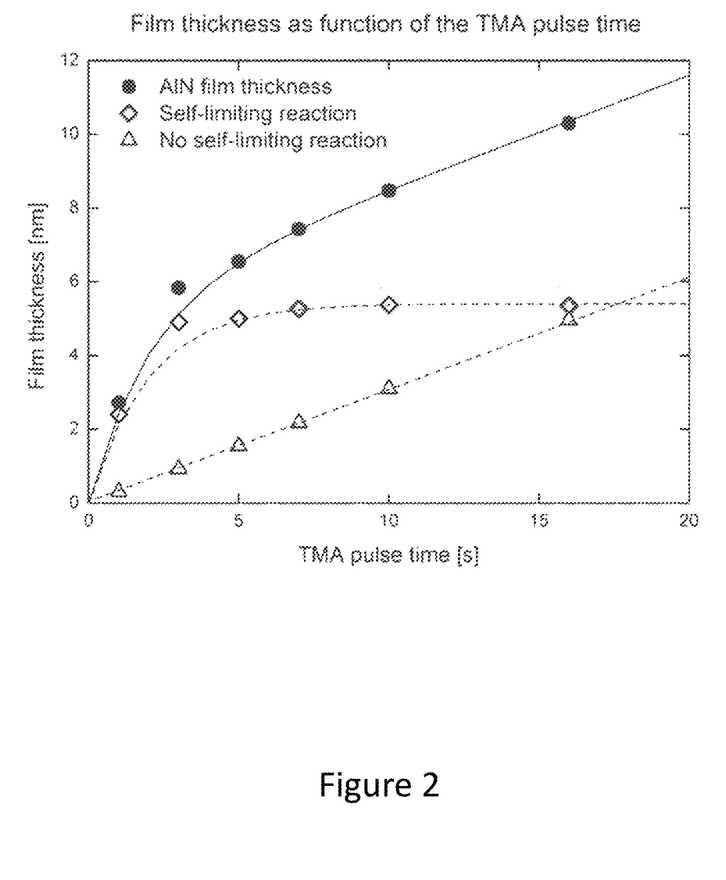
FIG. 2 is a chart showing deposited film thickness as a function of TMA pulse duration, according to some embodiments.

FIG. 2 is a chart showing deposited film thickness as a function of TMA pulse duration, for 70 cycles at a deposition temperature of 350° C. From the chart it can be observed that the film thickness did not saturate with increasing TMA pulse duration. Rather, increasing pulse durations provided increasing AlN film thicknesses. Thus, it is believed that the AlN deposition process is not self-limiting as would occur with pure ALD. Rather, the AlN deposition contains a self-limiting component (open diamonds) at a deposition rate of 1.25 Ang per cycle and a non-self-limiting component (open triangles) at a deposition rate of 0.044 Ang/s. The self-limiting component is evident at a TMA pulse duration of 3 second or longer. For TMA pulse durations of 16 seconds, the contribution of the non-self-limiting component and the self-limiting component to the deposited film thickness are about equally large. A TMA pulse duration of about 7 seconds was found to provide good deposition rates and high uniformity.

Figure 3:
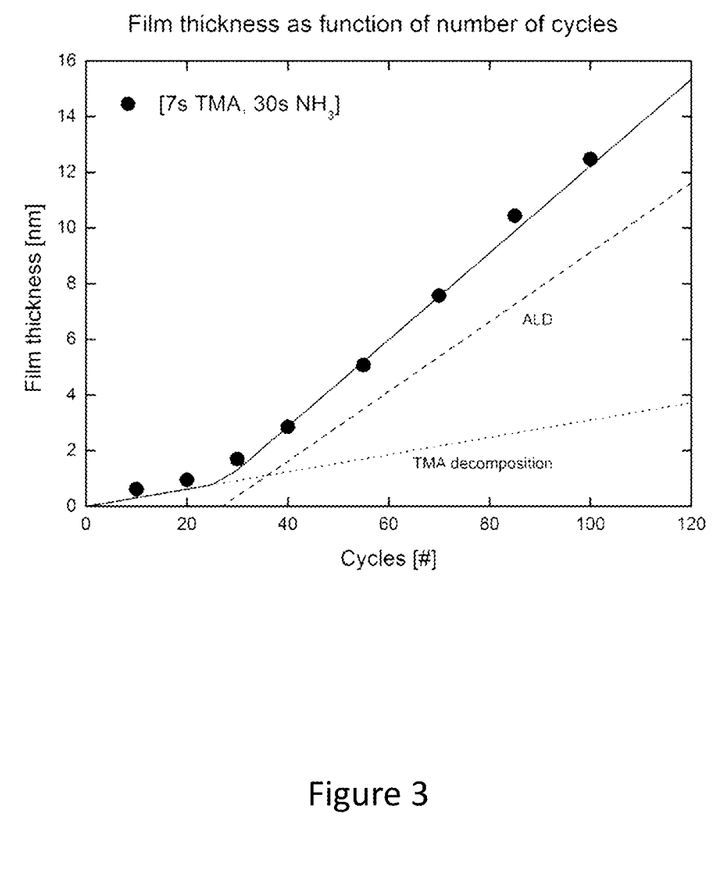
FIG. 3 is a chart showing deposited film thickness as a function of the number of deposition cycles performed, according to some embodiments.

FIG. 3 is a chart showing deposited film thickness as a function of the number of deposition cycles performed. Notably, over the first 30 to 40 cycles, the effective deposition rate is relatively low, with 0.31 Ang/cycle, and then the self-limiting component of 1.25 Ang/cycle is fully developed and the total deposition rate increases to 1.56 Ang/cycle. The low initial deposition rate is believed to be due to the self-limiting component of the AlN being inflicted with an initial inhibition period.

Figure 4:
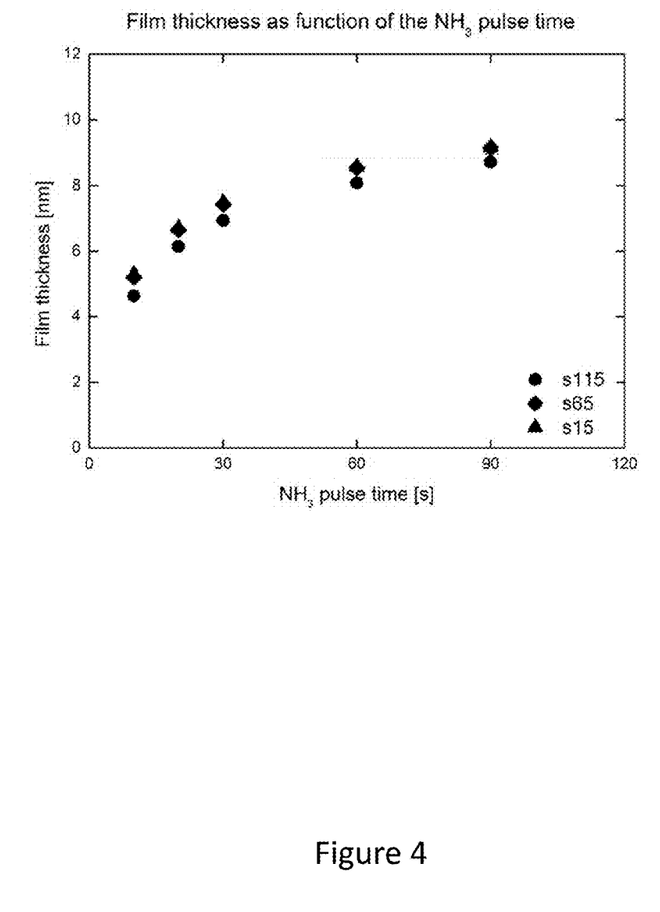
FIG. 4 is a chart showing deposited film thickness as a function of $NH_3$ pulse duration, according to some embodiments.
Figure 5:
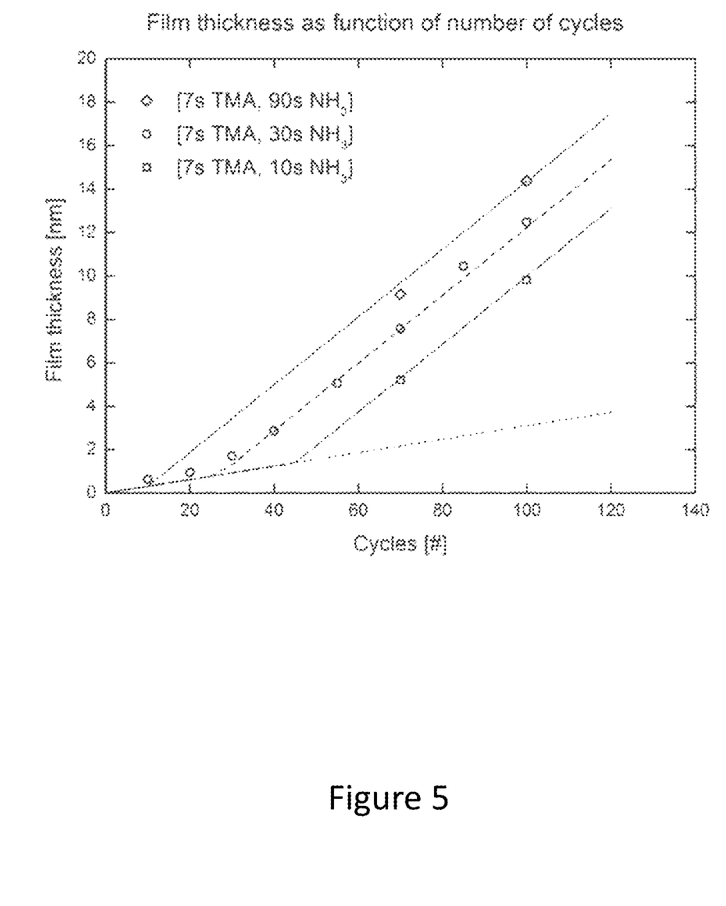
FIG. 5 is a chart showing deposited film thickness as a function of the number of deposition cycles, for various $NH_3$ pulse durations, according to some embodiments.

FIG. 4 is a chart showing deposited film thickness as a function of $NH_3$ pulse duration (for 70 cycles of deposition at 350° C.). The increase in deposited film thickness with increasing $NH_3$ pulse duration can be understood with the help of FIG. 5, showing the film thickness for three wafers at different wafer positions: S15, S65 and S115 are substrates in respectively the bottom, center and top region of the process chamber. It will be appreciated that the triangles and diamonds in the chart substantially overlap, demonstrating good uniformity of the film thickness over the furnace.

FIG. 5 is a chart showing deposited film thickness as a function of the number of deposition cycles, for various $NH_3$ pulse durations. The various $NH_3$ pulse durations were 10, 30, and 90 seconds. It was found that the inhibition period for the self-limiting deposition decreases with increasing $NH_3$ pulse duration. The inhibition period was about 10, about 30, and about 45 cycles for $NH_3$ pulse durations of 90, 30, and 10 seconds, respectively. This resulted in a higher effective deposition rates for longer $NH_3$ pulse durations. However, when the inhibition period was passed, the deposition rate per cycle was substantially equal for all $NH_3$ pulse durations. This indicates that even for the 10 second $NH_3$ pulse duration, fully self-limiting deposition had been obtained. It is contemplated that an $NH_3$ pulse duration of 3 seconds is adequate to obtain fully saturated, self-limiting deposition after passing the inhibition period.

Figure 6:
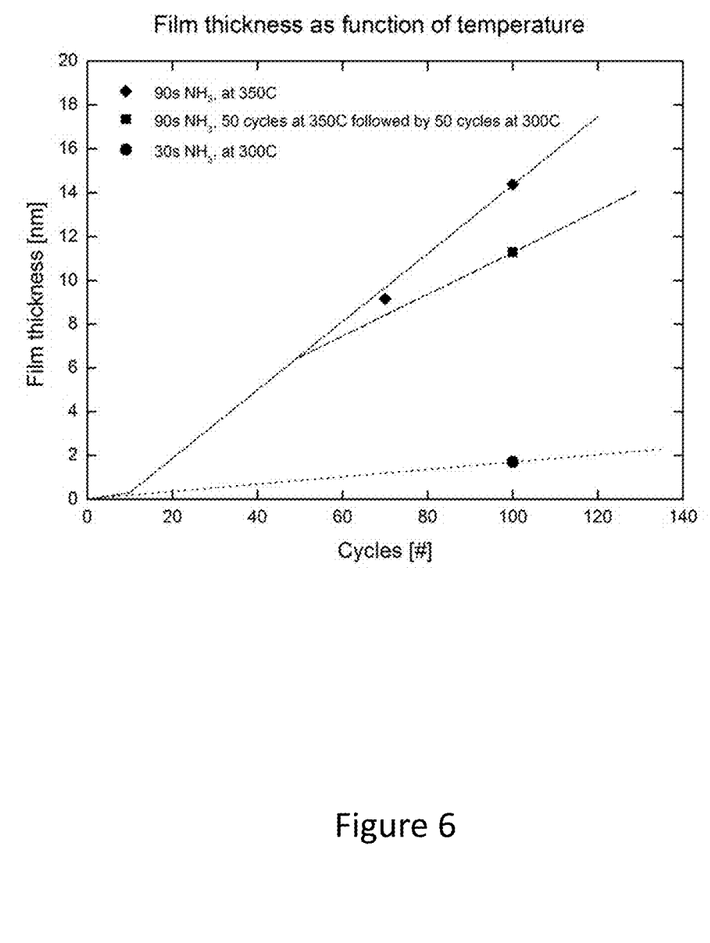
FIG. 6 is a chart showing deposited film thickness as a function of the number of deposition cycles, for different deposition temperatures, according to some embodiments.

FIG. 6 is a chart showing deposited film thickness as a function of the number of deposition cycles, for different deposition temperatures. Most depositions were performed at 350° C. At this temperature, 100 cycles resulted in a film thickness of about 14 nm. When the deposition temperature was lowered to 300° C., 100 cycles resulted in a film thickness of only about 2 nm. However, when the first 50 cycles were performed at 350° C., and then the deposition was continued at a lower temperature of 300° C., only a slight decrease in film thickness, to 11 nm, was observed. It is believed that, at the lower temperature, the inhibition period is substantially longer, resulting in a lower final film thickness. Once a closed AlN was formed, however, the deposited film thickness per cycle is only slightly dependent on the deposition temperature. Thus, it is believed that the surface plays a role in the decomposition of the precursor and the film formation process. These results indicate that a useful range of deposition temperatures for TMA is from about 300° C. to about 375° C. At temperature above 375° C. it is expected that the decomposition rate of TMA becomes so large that the process may no longer be controlled adequately.

Figure 7:
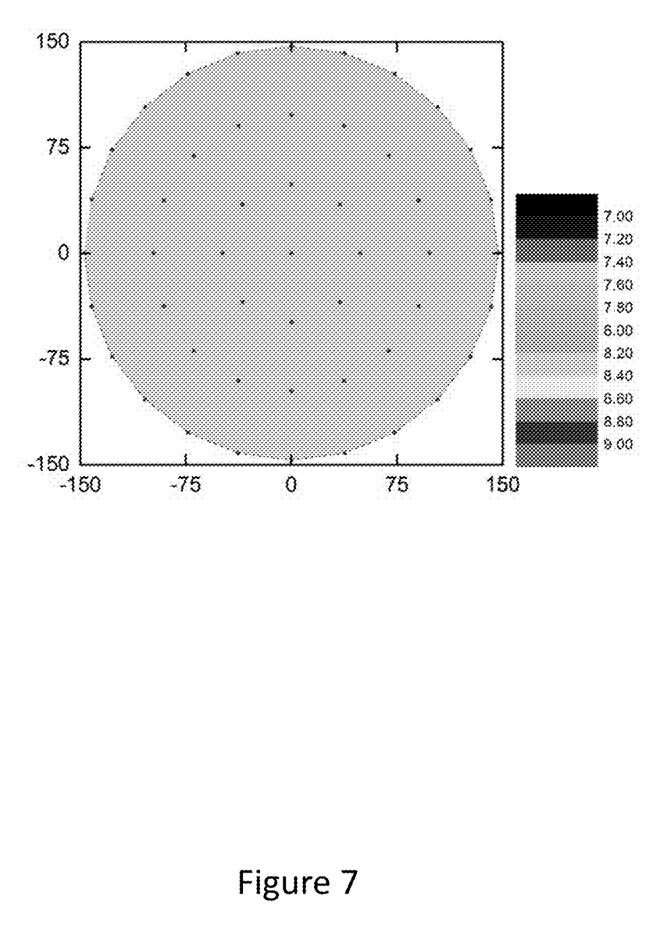
FIG. 7 shows the uniformity of a deposited AlN film, according to some embodiments.

FIG. 7 shows the uniformity of a deposited AlN film. The deposition conditions for this film were as described above were as described above under the example. The AlN film was found to be very uniform, having a film non-uniformity of $1\sigma=0.25\%$ across the substrate. The good uniformity is believed to indicate that the process was strongly surface-controlled. Such surface control is typically associated with a self-limiting process, but here the process had a non-self-limiting component, which made a significant contribution to the deposited film thickness. Nevertheless, the deposition process advantageously provided good surface control of the deposition.

The influence of the purge time on film uniformity was also evaluated. For the TMA purge step, times ranging from 1 seconds to 7 seconds were applied and no influence on the film uniformity was noticed. For the $NH_3$ purge step, purge times ranging from 3 seconds to 30 seconds were applied. For the three shortest purge times (3, 5, and 7 seconds), a significantly higher non-uniformity was observed than for purge times of 15 and 30 seconds, with the highest non-uniformity for the 3 second purge time and the non-uniformity gradually decreasing for the 5 and 7 second purge times. It is contemplated that $NH_3$ purge times of 7 seconds or more, and more preferably 15 seconds or more have advantages for forming highly uniform AlN films.

Although the above noted examples were performed with TMA, it is contemplated that other organic aluminum precursors would provide similar advantageous results. Such precursors are disclosed above, and can include, for example, aluminum alkyl precursors or alkyl-substituted aluminum chlorides or hydrides that have sufficient volatility and a decomposition temperature similar to TMA. Table 1 provides examples of some precursors.

| Al Precursor | Vapor Pressure (Torr) | Al Growth Temp. (° C.) |
| --- | --- | --- |
| Trimethylaluminum (TMA) $(CH_3)_3Al$ | 11 @ 20° C. | 300 |
| Triethylaluminum (TEA) $(CH_3CH_2)_3Al$ | 0.1 @ 36° C. | 160 |
| Triisobutylaluminum (TIBA) $[H(CH_3)_2CCH_2]_3Al$ | 0.1 @ 27° C. | 250 |
| Diethylaluminum chloride (DEACl) $CH_3CH_2)_2AlCl$ | 3 @ 60° C. | 340 |
| Dimethylaluminum hydride (DMAH) $(CH_3)_2AlH$ | 2 @ 25° C. | 240 |
| Tritertiarybutylaluminum $[(CH_3)_3C]_3Al$ | | 300-400° C. |

It will be appreciated by those skilled in the art that various modifications and changes can be made without departing from the scope of the invention. Similar other modifications and changes are intended to fall within the scope of the invention, as defined by the appended claims.

What is claimed is:

1. A process for depositing an aluminum nitride film, comprising:
   providing a batch furnace having a hot wall process chamber;
   loading a plurality of substrates into the process chamber;
   performing a plurality of deposition cycles on the plurality of substrates in the process chamber, each cycle comprising:
      exposing a surface of the substrates to a pulse of an aluminum precursor selected from the group consisting of alkyl aluminum compounds, alkyl-substituted aluminum chloride compounds, and alkyl-substituted aluminum hydride compounds; and
      after termination of the pulse of the aluminum precursor, exposing the surface of the substrates to a pulse of nitrogen precursor to allow the nitrogen precursor to react with the aluminum precursor on the substrate surface, wherein at least some of the cycles are performed at a deposition temperature of about 300° C. to about 375° C., wherein the deposition temperature is at a first value of about 350° C.±about 25° C. during an initial set of deposition cycles, and wherein the deposition temperature is at a second value of about 300° C.±about 25° C. during a subsequent set of deposition cycles.

2. The process of claim 1, wherein a deposition pressure in the process chamber is less than 1 Torr.

3. The process of claim 1, wherein a duration of the pulse of the aluminum precursor is about 3 seconds or more.

4. The process of claim 3, wherein the duration of the pulse of the aluminum precursor is about 5 to about 10 seconds.

5. The process of claim 3, wherein a duration of the pulse of the nitrogen precursor is about 3 seconds or more.

6. The process of claim 5, wherein the duration of the pulse of the nitrogen precursor is about 10 seconds or more.

7. The process of claim 5, wherein the duration of pulses of nitrogen precursor is at a first value during a first time period and decreases to a second value during a second time period.

8. The process of claim 1, comprising purging the aluminum precursor away from the substrates for about 1 second or more after exposing the surface of the substrate to the pulse of the aluminum precursor.

9. The process of claim 8, wherein purging the nitrogen precursor away from the substrates is performed for about 7 second or more.

10. The process of claim 1, wherein the nitrogen precursor is $NH_3$.

11. The process of claim 1, wherein the nitrogen precursor is hydrazine.

12. The process of claim 1, wherein a deposition pressure for depositing the aluminum nitride layer is about 100 to about 700 mTorr.

13. A process for depositing aluminum nitride, comprising:
providing a plurality of semiconductor substrates in a batch process chamber;
depositing an aluminum nitride layer on the substrates in the batch process chamber by performing a plurality of deposition cycles, each deposition cycle comprising:
flowing an aluminum precursor pulse into the batch process chamber;
removing aluminum precursor from the batch process chamber;
subsequently flowing a nitrogen precursor pulse into the batch process chamber; and
removing nitrogen precursor from the batch process chamber after flowing the nitrogen precursor and before flowing another pulse of the aluminum precursor, wherein the substrates are not exposed to plasma during the deposition cycle, wherein the deposition temperature during an initial period of performing the plurality of deposition cycles is at least about 25° C. higher than the deposition temperature during a subsequent period of performing the plurality of deposition cycles.

14. The process of claim 13, wherein depositing the aluminum nitride layer is performed at pressures forming the aluminum nitride layer with a non-uniformity of $1\sigma=0.25\%$ or better across the substrate.

15. The process of claim 13, wherein the deposition temperature during the initial period is at least about 50° C. higher than the deposition temperature during the subsequent period.

16. The process of claim 13, wherein the deposition temperature during the initial period is about 350° C.±about 25° C., and wherein the deposition temperature during the subsequent period is about 300° C.±about 25° C.

17. The process of claim 13, wherein a duration of the nitrogen precursor removal is at least about 1.5 times the duration of the aluminum precursor purge.

18. The process of claim 13, wherein removing the aluminum precursor and removing the nitrogen precursor comprises purging the batch process chamber.

19. The process of claim 13, wherein the semiconductor substrate comprises gallium nitride, where the aluminum nitride layer is deposited on the gallium nitride.

20. The process of claim 19, further comprising:
forming a gate dielectric over the aluminum nitride layer.

21. The process of claim 20, wherein the gate dielectric comprises silicon oxide ($SiO_2$), zirconium oxide ($ZrO_2$), hafnium oxide ($HfO_2$), aluminum oxide ($Al_2O_3$), or a combination thereof.

22. The process of claim 21, wherein the combination is a bi- or tri-layer or a nano-laminate, each layer of the bi- or tri-layer or a nano-laminate comprising one of silicon oxide ($SiO_2$), zirconium oxide ($ZrO_2$), hafnium oxide ($HfO_2$), or aluminum oxide ($Al_2O_3$).

23. The process of claim 20, wherein forming the gate dielectric is performed in situ in the process chamber.

24. The process of claim 13, wherein the deposition temperature during the initial period is at least about 50° C. higher than the deposition temperature during the subsequent period.

25. The process of claim 13, wherein the deposition temperature during the initial period is about 350° C.±about 25° C., and wherein the deposition temperature during the subsequent period is about 300° C.±about 25° C.

* * * * *

UNITED STATES PATENT AND TRADEMARK OFFICE
CERTIFICATE OF CORRECTION

PATENT NO. : 9,552,979 B2
APPLICATION NO. : 13/907718
DATED : January 24, 2017
INVENTOR(S) : Werner Knaepen et al.

It is certified that error appears in the above-identified patent and that said Letters Patent is hereby corrected as shown below:

In the Specification

In Column 8 at Line 32 (approx.), Change "$(CH_3)\ _3Al$" to --$(CH_3)_3Al$--.

In Column 8 at Line 34 (approx.), Change "$(CH_3CH_2)\ _3Al$" to --$(CH_3CH_2)_3Al$--.

In Column 8 at Line 35 (approx.), Change "$[H(CH_3]\ _2CCH_2]\ _3Al$" to --$[H(CH_3)_2CCH_2]_3Al$--.

In Column 8 at Line 37 (approx.), Change "$CH_3CH_2)\ _2AlCl$" to --$(CH_3CH_2)_2AlCl$--.

In Column 8 at Line 39 (approx.), Change "$(CH_3)\ _2AlH$" to --$(CH_3)_2AlH$--.

In Column 8 at Line 41 (approx.), Change "$[(CH_3)\ _3C]\ _3Al$" to --$[(CH_3)_3C]_3Al$--.

Signed and Sealed this
Twenty-third Day of May, 2017

Michelle K. Lee
*Director of the United States Patent and Trademark Office*